US012652859B2

(12) United States Patent
Tung et al.

(10) Patent No.: US 12,652,859 B2
(45) Date of Patent: Jun. 9, 2026

(54) STANDARD CELLS WITH MULTI-WELL SIZE PLACEMENTS

(71) Applicant: Taiwan Semiconductor Manufacturing Company, Ltd., Hsin-Chu (TW)

(72) Inventors: Yu-Lung Tung, Kaohsiung City (TW); Xiaodong Wang, Hsinchu City (TW); Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 399 days.

(21) Appl. No.: 18/483,604

(22) Filed: Oct. 10, 2023

(65) Prior Publication Data

US 2025/0120184 A1     Apr. 10, 2025

(51) Int. Cl.
| | |
|---|---|
| *H10D 89/10* | (2025.01) |
| *H10D 84/85* | (2025.01) |
| H10D 30/43 | (2025.01) |
| H10D 30/67 | (2025.01) |
| H10D 62/10 | (2025.01) |

(52) U.S. Cl.
CPC ............. *H10D 89/10* (2025.01); *H10D 84/85* (2025.01); *H10D 30/43* (2025.01); *H10D 30/6735* (2025.01); *H10D 30/6757* (2025.01); *H10D 62/121* (2025.01)

(58) Field of Classification Search
CPC ........ H10D 89/10; H10D 84/85; H10D 30/43; H10D 30/6735; H10D 30/6757; H10D 62/121; H10D 84/851; H10D 84/0191; H10D 84/859; H10D 30/501; H10D 84/974; H10D 84/038
See application file for complete search history.

(56) References Cited

U.S. PATENT DOCUMENTS

2023/0096645 A1* 3/2023 Chen .................... H10D 84/907
257/390

* cited by examiner

*Primary Examiner* — Thanh Y. Tran
(74) *Attorney, Agent, or Firm* — HAYNES AND BOONE, LLP

(57) ABSTRACT

A semiconductor structure includes first standard cells having first active regions formed over first alternating n-type and p-type wells, the first active regions and the first alternating n-type and p-type wells each extends lengthwise along a first direction, each of the first standard cells includes a first n-type well and a first p-type well; and second standard cells adjacent to the first standard cells, the second standard cells having second active regions formed over second alternating n-type and p-type wells, the second active regions and the second alternating n-type and p-type wells each extends lengthwise along the first direction, each of the second standard cells includes a second n-type well and a second p-type well. The first standard cells have a first cell height, the second standard cells have a second cell height, and the second cell height is greater than the first cell height.

20 Claims, 8 Drawing Sheets

STANDARD CELLS WITH MULTI-WELL SIZE PLACEMENTS

BACKGROUND

The integrated circuit (IC) industry has experienced exponential growth. Technological advances in semiconductor manufacturing have produced generations of ICs, where each generation has smaller and more complex circuits than the previous generation. In the course of IC evolution, functional density (i.e., the number of interconnected IC devices per chip area) has generally increased while geometry size (i.e., dimensions and/or sizes of IC features and/or spacings between these IC features) has decreased.

To facilitate aggressive scaling and to improve functional density, standard cells are developed as basic building blocks when designing and fabricating IC semiconductor structures. Standard cells serve design applications with minimum area cost due to their compactness and reusability. Generally speaking, standard cells have fixed heights and place n-type and p-type wells with the same size periodically on a substrate. The periodic fixed heights may be defined by a width of the n-type well plus a width of the p-type well, from which IC structures are formed thereon. The IC structures include the corresponding device (or active region), gate, metal contact, and upper metal/via placed in each standard cell, some of which may span across multiple cells. The IC structures placed over the standard cells may have limited geometry and sizes to simplify process complexity and to achieve the aggressive shrinkage target.

However, fixed cell heights in standard cells limit device size options, which may be critical in certain applications. For example, in a device array, certain devices require wider active regions (e.g., for driving higher current) than those available in a single standard cell height, and other devices require narrower active regions (e.g., for better leakage control) than those available in a single standard cell height.

Therefore, although existing layouts and structures related to standard cells have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments. Further, the accompanying figures may implicitly describe features not explicitly described in the detailed description.

FIG. 5C-1 illustrates a top view of a device layout block defined by standard cells and showing metal lines over the device level structures of FIG. 5B, according to an embodiment of the present disclosure.

FIG. 5C-2 illustrates a top view of a device layout block defined by standard cells and showing metal lines over the device level structures of FIG. 5B, according to another embodiment of the present disclosure.

DETAILED DESCRIPTION

Figure 1C:
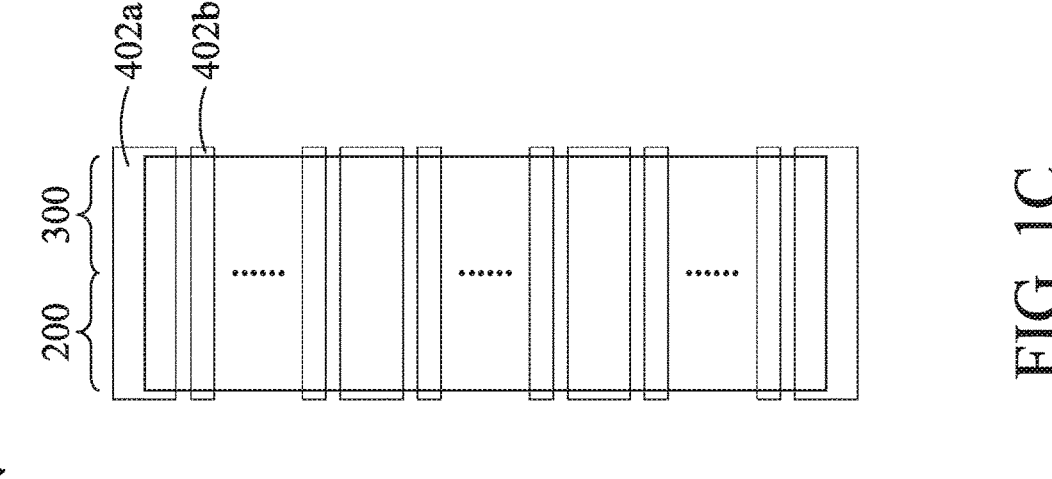
FIG. 1C illustrates a top view of a device layout defined by standard cells and showing metal lines over the device level structures of FIG. 1B, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower." "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximately," and the like, the term is intended to encompass numbers that are within a reasonable range including the number described, such as within +/−10% of the number described, or other values as understood by person skilled in the art. For example, the term "about 5 nm" may encompass the dimension range from 4.5 nm to 5.5 nm. And when comparing a dimension or size of a feature to another feature, the phrases "substantially the same." "essentially the same." "of similar size," and the like, are understood to be within +/−10% between the compared features, or other values as understood by person skilled in the art. Further, disclosed dimensions of the different features can implicitly disclose dimension ratios between the different features.

The present disclosure relates to standard cell device layouts having varied cell heights. Standard cells may be used in IC design for compact device layouts and fabricating corresponding semiconductor structures. However, when standard cells are limited to a single fixed cell height, device options become limited. To allow for flexibility in device size, the present disclosure provides standard cells having multi-size n-type and p-type wells while accommodating the standard cell framework. That is, in a standard cell block, standard cells of different sized n-type and p-type wells may be integrated together. Having different sized n-type and p-type wells allows devices and contact size/positions to vary according to performance needs. Meanwhile, the metal lines over the device level structures have the flexibility to keep the same settings as those for the single fixed cell height scheme or to adopt wider sizes if needed. The present disclosure also contemplates incorporating dielectric gates between standard cells of different cell heights for isolation between devices.

Embodiments shown in the present disclosure are implemented with Gate-All-Around (GAA) field effect transistors (FETs), but the present disclosure is not limited thereto. GAA FETs refer to transistors having gate stacks (gate electrodes and gate dielectric layers) surrounding transistor channels, such as vertically-stacked gate-all-around horizontal nanowire or nanosheet MOSFET devices. The transistor channels and adjacent source/drain features are formed from active regions over a substrate such as fin active regions protruding from a substrate.

Those of ordinary skill in the art should appreciate that they may readily use the present disclosure as a basis for designing or modifying other structures for carrying out the same purposes and/or achieving the same advantages of the embodiments introduced herein. For example, other types of FETs may also implement the embodiments of the present disclosure, such as planar MOSFETs or FinFETs.

Figure 1B:
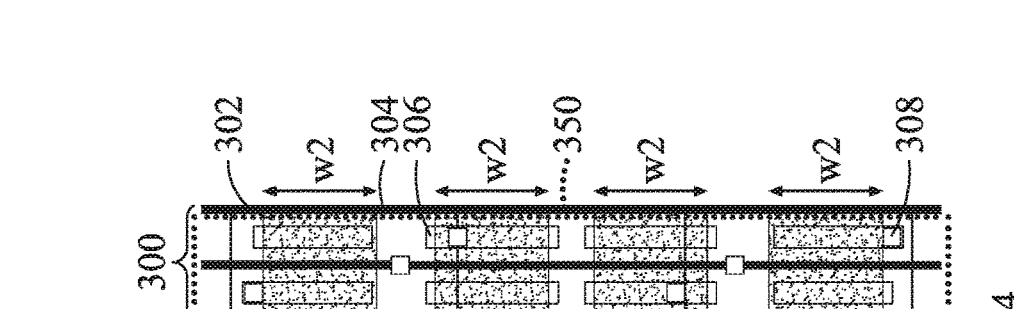
FIG. 1B illustrates a top view of a device layout defined by standard cells and showing device level structures over the n-type and p-type wells of FIG. 1A, according to an embodiment of the present disclosure.
Figure 1B:
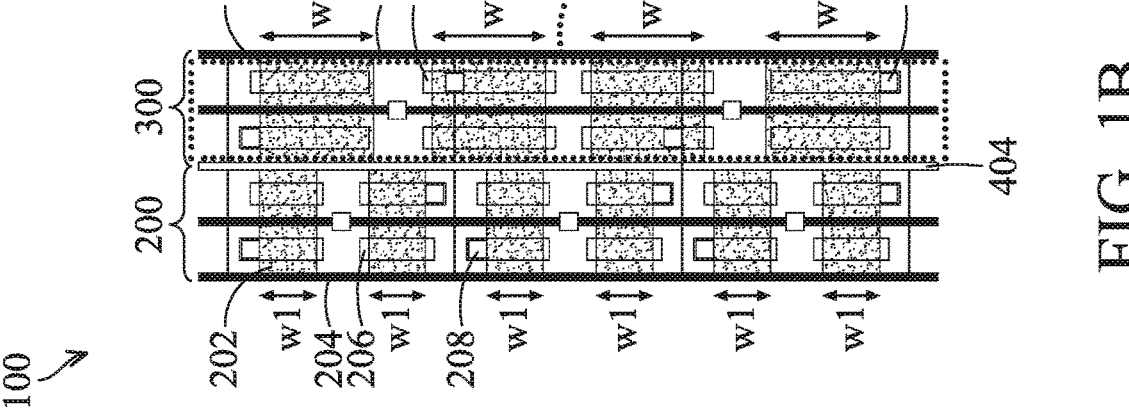
Figure 1A:
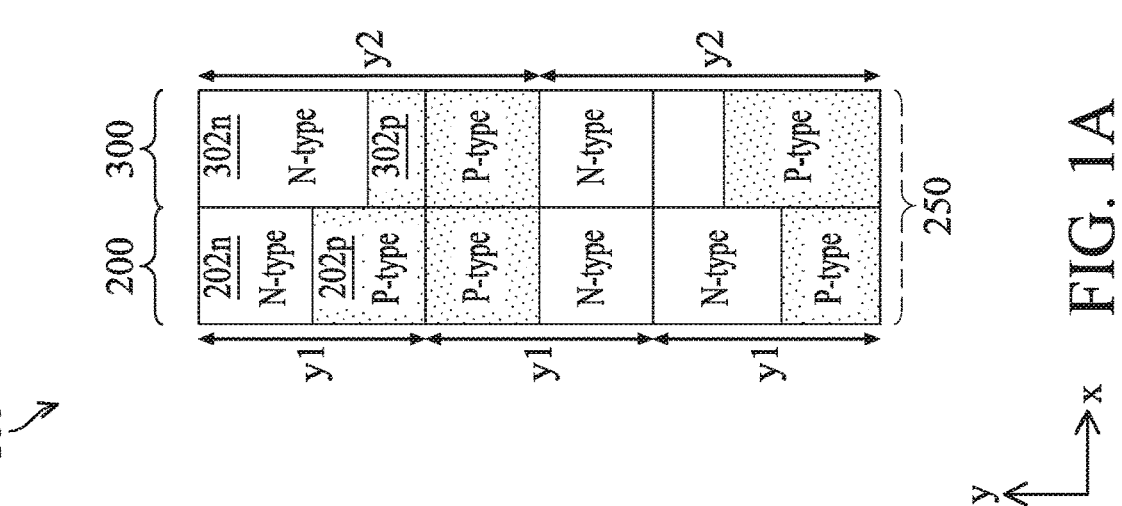
FIG. 1A illustrates a top view of a device layout defined by standard cells and showing n-type and p-type wells over a substrate, according to an embodiment of the present disclosure.

FIG. 1A illustrates a top view of a standard cell device layout 100, according to an embodiment of the present disclosure. The device layout 100 includes first standard cells 200 and second standard cells 300 each having alternating n-type and p-type wells along the y direction. The alternating n-type and p-type wells may be formed in a substrate through a suitable doping process, such as ion implantation, diffusion, other suitable techniques or a combination. The substrate may be a silicon (Si) substrate, or a substrate having other semiconductor materials such as germanium (Ge), silicon carbide (SiC), silicon germanium (SiGe), or diamond. Each of the first standard cells 200 includes a first n-type well 202n and a first p-type well 202p, where each of the first standard cells 200 has a first cell height y1 defined by a total width of the first n-type well 202n and the first p-type well 202p along the y direction. In the present embodiment, the first n-type well 202n and the first p-type well 202p have substantially the same width. Each of the second standard cells 300 includes a second n-type well 302n and a second p-type well 302p, where each of the second standard cells 300 has a second cell height y2 defined by a total width of the second n-type well 302n and the second p-type well 302p along the y direction. In the present embodiment, the second n-type well 302n and the second p-type well 302p have substantially the same width. As shown, the second cell height y2 is greater than the first cell height y1. And as such, the second n-type well 302n has a greater width along the y direction than the first n-type well 202n, and the second p-type well 302p has a greater width along the y direction than the first p-type well 202p. A ratio of the second cell height y2 to the first cell height y1 may range between about 1.25 to about 2. In the present embodiment, a ratio of the second cell height y2 to the first cell height y1 is about 1.5.

Still referring to FIG. 1A, along the x direction, the edge boundaries of the first standard cells 200 are periodically aligned with the edge boundaries of the second standard cells 300. In the present embodiment, the edge boundaries are periodically aligned after every 3 first standard cell height y1 and every two second standard cell height y2. At these edge boundaries, the alternating n-type and p-type wells in the first standard cells 200 are aligned with the alternating n-type and p-type wells in the second standard cells 300 along the x direction. Moreover, at every edge boundary of the second standard cells 300, the first n-type well 202n is aligned with the second n-type well 302n, and the first p-type well 202p is aligned with the second p-type well 302p.

Still referring to FIG. 1A, although the device layout 100 is described with respect to two different standard cells 200 and 300 adjacent to each other along the x direction having different fixed cell heights y1 and y2, the device layout 100 may be described in other ways without departing from the spirit and scope of the present disclosure. For example, FIG. 1A may be described has having standard cells 250 having a single fixed height y1 or y2 but each standard cell 250 encompasses both the first n- and p-type wells 202n and 202p and both the second n- and p-type wells 302n and 302p. In other words, the standard cells 250 having the fixed height y1 or y2 may have different well width settings within a same standard cell 250 such that edge boundaries of the n-type and p-type wells do not always align between standard cells 250.

FIG. 1B illustrates a top view of a device layout 100 defined by standard cells 200 and 300 and showing device level structures over the n-type and p-type wells 202n, 202p, 302n, and 302p of FIG. 1A. In other words, the device level structures shown in FIG. 1B overlays on top of the n-type and p-type wells of FIG. 1A. Device level structures in the first standard cells 200 include first active regions 202 formed over first n-type and p-type wells 202*n* and 202*p* (see FIG. 1A), first metal gates 204 formed over channel regions of the first active regions 202, first metal contacts 206 (or source/drain contacts) formed over source/drain features of the first active regions 202, and first metal vias 208 over the first metal contacts 206 and over the first metal gates 204. Device level structures in the second standard cells 300 include second active regions 302 formed over second n-type and p-type wells 302*n* and 302*p* (see FIG. 1A), second metal gates 304 formed over channel regions of the second active regions 302, second metal contacts 306 (or source/drain contacts) formed over source/drain features of the second active regions 302, and second metal vias 308 over the second metal contacts 306 and over the second metal gates 304.

Still referring to FIG. 1B, the first and second active regions 202 and 302 extends lengthwise along the x direction. Each first and second active regions 202 and 302 are separated from other first and second active regions 202 and 302 by an isolation structure (not shown). The isolation structure may be a shallow trench isolation (STI) structure having a dielectric material such as silicon oxide, silicon oxynitride, fluorine-doped silicate glass (FSG), a low-k dielectric, combinations thereof, and/or other suitable materials. The isolation structure covers a top surface of the substrate and surrounds sidewall portions of the first and second active regions 202 and 302. Described in another way, the first and the second active regions 202 and 302 refer to semiconductor features that are exposed in openings of the isolation structure. In the present embodiment, the active regions 202 and 302 extrudes from a substrate to above a top surface of the isolation structure. The substrate may include n-type or p-type wells formed therein as described above. The first active regions 202 have a first width w1 along the y direction, the second active regions 302 have a second width w2 along the y direction, and the second width w2 is greater than the first width w1. The second active regions 302 can have a larger width than the first active regions 202 due to the enlarged second n-type and p-type wells 302*n* and 302*p* underlying the second active regions 302. In each first standard cells 200, there are two first active regions 202, one of them extends over a first n-type well 202*n* and the other extends over a first p-type well 202*p*. In the embodiment shown, each of the two first active regions 202 in each first standard cell 200 has the same first width w1. In each second standard cells 300, there are two second active regions 302, one of them extends over a second n-type well 302*n* and the other extends over a second p-type well 302*p*. In the embodiment shown, each of the two second active regions 302 in each second standard cell 300 has the same second width w2. The first and second active regions 202 and 302 each include channel regions and source/drain regions adjacent the channel regions. The channel regions are portions of the first and second active regions underlying the respective metal gates 204/304. The source/drain regions includes source/drain epitaxial features that connect to transistor channels of the channel regions. The source/drain features may be doped with n-type dopants and/or p-type dopants. In some embodiments, for n-type transistors, epitaxial source/drain features include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial source/drain features include silicon germanium or germanium and can be doped with boron, other p-type dopant, or combinations thereof (for example, forming Si:Ge:B epitaxial source/drain features).

Still referring to FIG. 1B, the first and second metal gates 204 and 304 extends lengthwise along the y direction and lands on channel regions of the first and second active regions 202 and 302. The first and second metal gates 204 and 304 may extend over multiple channel regions of the first and second active regions 202 and 302 across multiple first and second standard cells 200 and 300. Each of the metal gates may include an interfacial layer (e.g., silicon oxide layer), a gate dielectric layer over the interfacial layer, and a gate electrode over the gate dielectric layer. The gate dielectric layer includes a high-k dielectric material, such as materials having a dielectric constant greater than silicon oxide (k≈3.9). The gate dielectric layer may include HfO, LaO, ZrO, AlO, TiO, or TaO. The gate electrode includes a suitable conductive material, such as Al, W, Co, TiAl, TiN, or other metal gate materials.

Still referring to FIG. 1B, the first and second metal contacts 206 and 306 extends lengthwise along the y direction and lands on source/drain features of the first and second active regions 202 and 302. The first metal contacts 206 are disposed between first metal gates 204 and spans a width between the first metal gates 204 along the x direction. The first metal contacts 206 may span a length greater than the first width w1 along the y direction. The second metal contacts 306 are disposed between second metal gates 304 and spans a width between the second metal gates 304 along the x direction. The second metal contacts 306 may span a length greater than the second width w2 along the y direction. The second metal contacts 306 can span a longer length than the first metal contacts 206 due to the larger second active regions 302 and the bigger spacing in the second standard cells 300. In the present embodiment, the second metal contacts 306 may have a similar width in the x direction as the first metal contacts 206. The first and second metal contacts 206 and 306 may include titanium (Ti), ruthenium (Ru), copper (Cu), nickel (Ni), cobalt (Co), tungsten (W), tantalum (Ta), or molybdenum (Mo). In an embodiment, silicide features are first formed over the source/drain features of the first and second active regions 202 and 302, then the first and second metal contacts 206 and 306 are formed over the silicide features. The silicide features may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Still referring to FIG. 1B, several first metal vias 208 and second metal vias 308 are disposed over and coupled to the metal gates 204/304 or the metal contacts 206/306. These metal vias 208/308 allow the metal gates 204/304 or the metal contacts 206/306 to electrically couple to a higher material layer (e.g., metal lines) in the z direction. Some of the first metal vias 208 may electrically couple first metal contacts 206 to upper level power lines, and other first metal vias 208 may electrically couple first metal gates 204 to upper level signal lines. Some of the second metal vias 308 may electrically couple second metal contacts 306 to upper level power lines, and other second metal vias 308 may electrically couple second metal gates 304 to upper level signal lines. The first metal vias 208 and second metal vias 308 may include any suitable conductive materials such as tungsten. The locations of the first metal vias 208 and the second metal vias 308 may be periodic from cell to cell.

These locations may be designed such that same metal lines (i.e., metal lines 402a and 402b in FIG. 1C) may directly land on both the first metal vias 208 and the second metal vias 308 for same node connections (i.e., power lines or signal lines).

FIG. 1C illustrates a top view of a device layout 100 defined by standard cells 200 and 300 and showing metal lines 402a and 402b over the device level structures of FIG. 1B. In other words, the metal lines 402a and 402b shown in FIG. 1C overlays on top of the device level structures of FIG. 1B. Specifically, the metal lines 402a and 402b extends lengthwise along the x direction and lands on the first metal vias 208 and second metal vias 308 of the first and second standard cells 200 and 300. The metal lines 402a may correspond to power lines that electrically connect to source/drain features of the first and second standard cells 200 and 300, and the metal lines 402b may correspond to signal lines that electrically connect to metal gates 204 and 304 of the first and second standard cells 200 and 300. In the embodiment shown, a same metal line (e.g., metal line 402a) may electrically connect to multiple source/drain features of the first and second active regions 202 and 302. This same metal line has a same width that continuously extends over the first and the second standard cells 200 and 300 along the x direction. In the same way, another same metal line (e.g., metal line 402b) may electrically connect to multiple metal gates 204 and 304 of the first and second active regions 202 and 302. This another same metal line has a same width that continuously extends over the first and the second standard cells 200 and 300 along the x direction. As shown in FIG. 1C, the same upper metal placement (i.e., metal lines 402a and 402b) can be used for both the first and second standard cells 200 and 300 for simplifying process complexity and promoting uniformity. That is, although the well type and the device level structures between the first and second standard cells 200 and 300 are different (to provide more device options), starting from the first metal line level shown in FIG. 1C, the upper metal placements can be the same between the first and second standard cells 200 and 300.

Figure 1D:
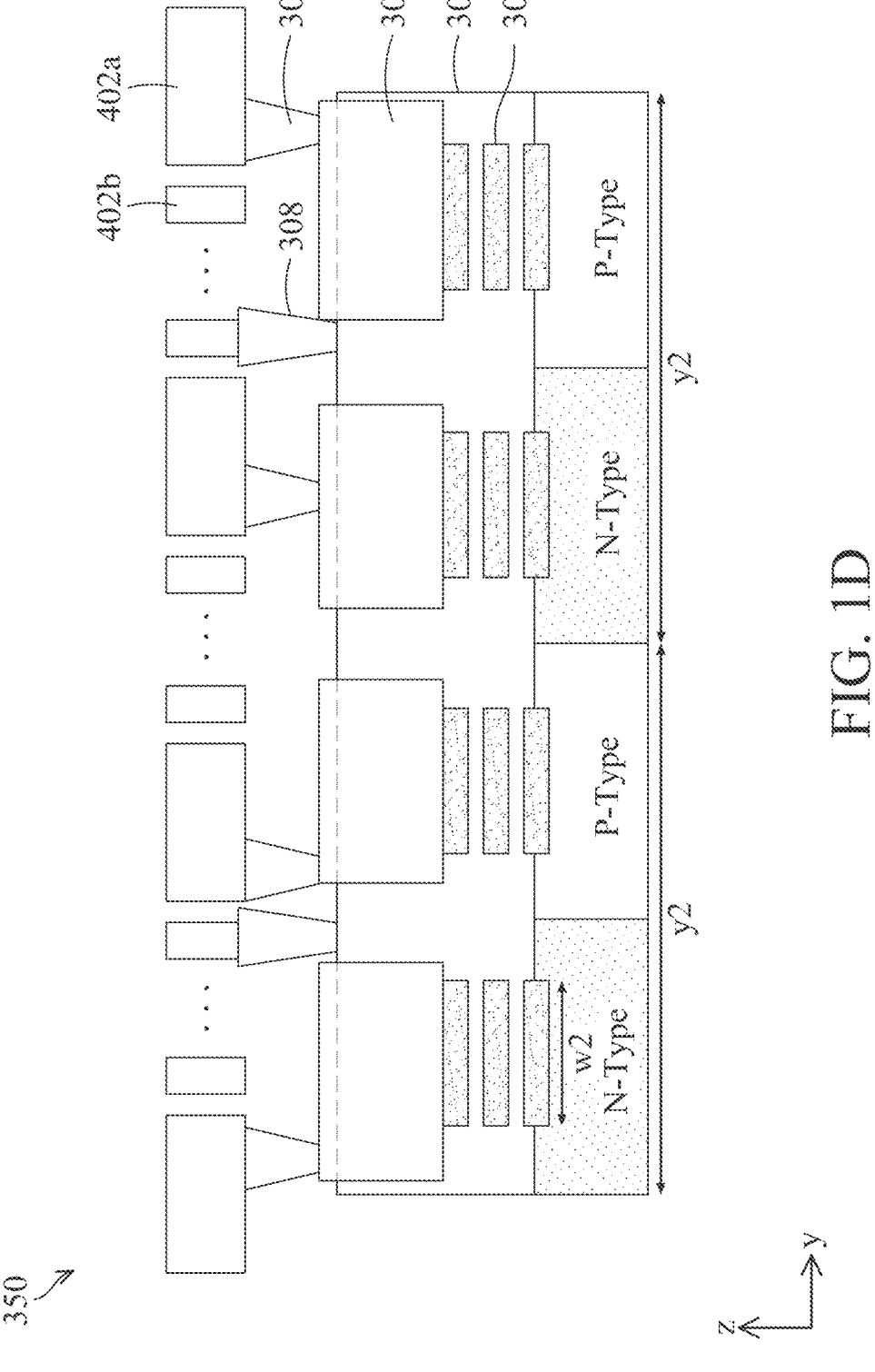
FIG. 1D illustrates a cross-sectional view of a semiconductor structure in a device region of the device layouts in FIGS. 1A-1C, according to an embodiment of the present disclosure.

FIG. 1D illustrates a cross-sectional view of a semiconductor structure in a device region 350 of the device layouts 100 shown in FIGS. 1A-1C. The device region 350 is shown in FIG. 1B as a dashed box surrounding the standard cells 300. Note that although the dashed box is only shown in FIG. 1B, the device region 350 would also include corresponding features shown in FIGS. 1A and 1C. FIG. 1D shows two standard cells 300 adjacent to each other along the y direction and each having the second cell height y2. In each of the standard cells 300, there is an active region of the second active regions 302 formed over a p-type well for an n-type transistor and another active region of the second active regions 302 over an n-type well for a p-type transistor. Each of the active regions in the second active regions 302 has the second width w2. The device region 350 shows a second metal gate 304 formed over each of the second active regions 302 in the two standard cells 300. With the second metal gate 304, each of the two standard cells 300 forms a CMOS device having an n-type transistor and a p-type transistor. As described previously and as shown here, in each standard cell 300, there are second metal contacts 306 over source/drain regions of the second active regions 302, second metal vias 308 over the second metal gate 304 or over the second metal contacts 306, and metal lines 402a or 402b over the second metal vias 308. In the embodiment shown, a top surface of the second metal contacts 306 is above a top surface of the second metal gate 304. As such, the second metal vias 308 that couple between the metal lines 402b and the second metal gate 304 may extend deeper than the second metal vias 308 that couple between the metal lines 402a and the second metal contacts 306. Although not shown, the device region adjacent the device region 350 and surrounding the standard cells 200 would show a similar cross-sectional view as FIG. 1D, except that it would show three standard cells 200 adjacent to each other along the y direction each having the first cell height y1, and that each of the active regions in the standard cells 200 would have the first width w1 with corresponding gate, vias, and metal lines over it.

FIGS. 2A-2D illustrates another embodiment of the present disclosure and is similar to FIGS. 1A-1D, respectively. Unless noted otherwise, the features described with respect to FIGS. 1A-1D equally apply to the FIGS. 2A-2D, respectively. These features will not be repeated again for the sake of brevity. The difference in FIGS. 2A-2D is that the first active regions 202 may have varied widths within a same first standard cell 200, and the second active regions 302 may have varied widths within a same second standard cell 300.

Figure 2C:
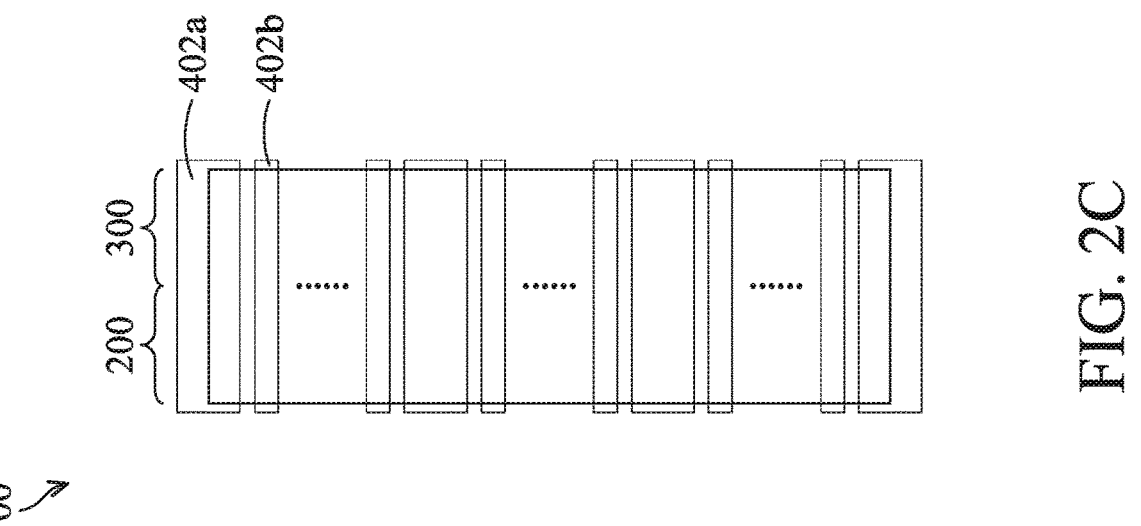
FIG. 2C illustrates a top view of a device layout defined by standard cells and showing metal lines over the device level structures of FIG. 2B, according to an embodiment of the present disclosure.
Figure 2B:
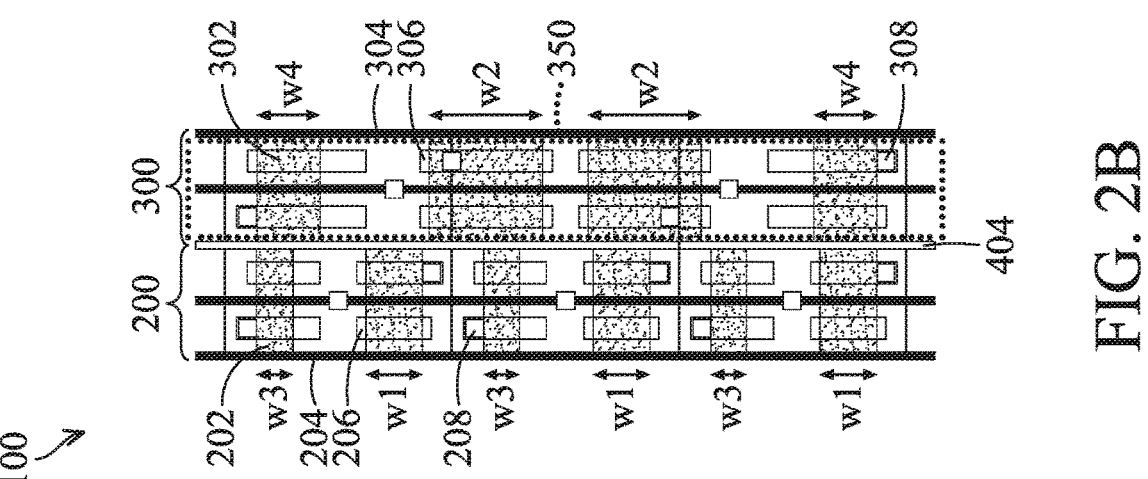
FIG. 2B illustrates a top view of a device layout defined by standard cells and showing device level structures over the n-type and p-type wells of FIG. 2A, according to an embodiment of the present disclosure.
Figure 2A:
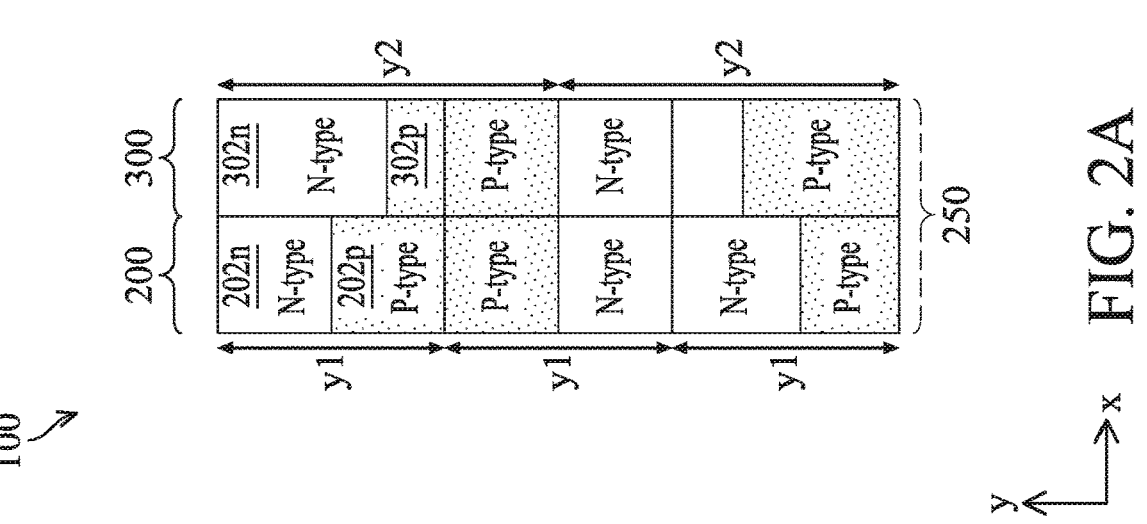
FIG. 2A illustrates a top view of a device layout defined by standard cells and showing n-type and p-type wells over a substrate, according to an embodiment of the present disclosure.
Figure 2D:
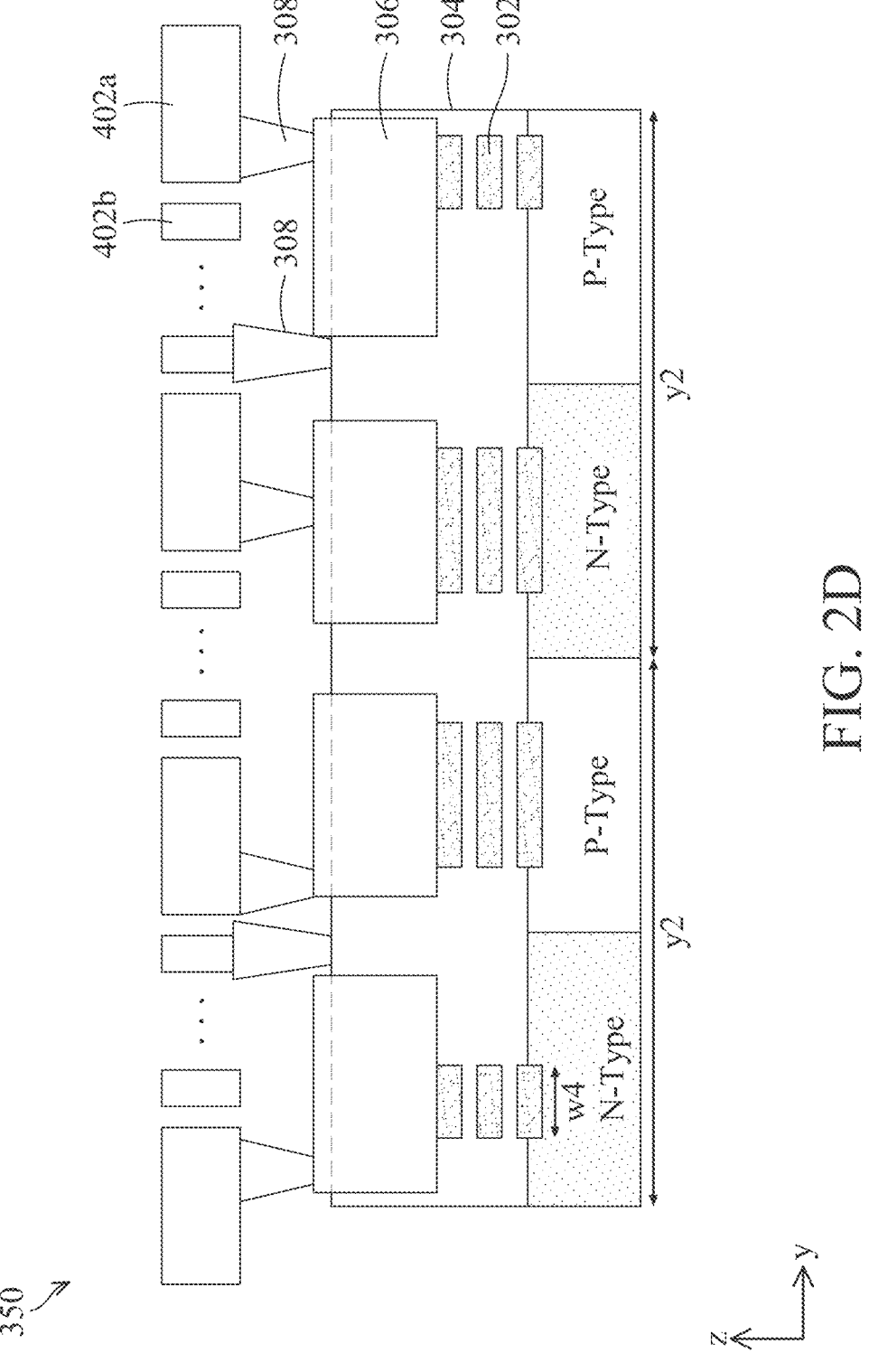
FIG. 2D illustrates a cross-sectional view of a semiconductor structure in a device region of the device layouts in FIGS. 2A-2C, according to an embodiment of the present disclosure.

As shown in FIG. 2B, one of the first active regions 202 in a first standard cell 200 may have a width w1 and another one of the first active regions 202 in the first standard cell 200 may have a width w3. The width w1 and the width w3 are different for different design applications. In the embodiment shown, the width w1 corresponds to the first width w1 described above with respect to FIGS. 1A-1D, and the width w3 is smaller than the width w1. In an embodiment, within a same first standard cell 200, one of the first active regions 202 has a width w1 formed over a first p-type well 202p and another one of the first active regions 202 has a width w3 formed over a first n-type well 202n. Alternatively, within a same first standard cell 200, one of the first active regions 202 has a width w3 formed over a first p-type well 202p and another one of the first active regions 202 has a width w1 formed over a first n-type well 202n.

Still referring to FIG. 2B, one of the second active regions 302 in a second standard cell 300 may have a width w2 and another one of the second active regions 302 in the second standard cell 300 may have a width w4. The width w2 and the width w4 are different for different design applications. In the embodiment shown, the width w2 corresponds to the second width w2 described above with respect to FIGS. 1A-1D, and the width w4 is smaller than the width w2. In an embodiment, within a same second standard cell 300, one of the second active regions 302 has a width w2 formed over a second p-type well 302p and another one of the second active regions 302 has a width w4 formed over a second n-type well 302n. Alternatively, within a same second standard cell 300, one of the second active regions 302 has a width w4 formed over a second p-type well 302p and another one of the second active regions 302 has a width w2 formed over a second n-type well 302n. In further embodiments, each of the widths w2 and w4 is greater than each of the widths w1 and w3. For example, the width w2 is greater than the width w4, the width w4 is greater than the width w1, and the width w1 is greater than the width w3. In these embodiments, even the smaller width w4 in the second standard cells 300 is greater than the bigger width w1 in the first standard cells 200. This is made possible by enlarging the cell heights for the standard cells 300 to an adequate degree. In an embodiment, this requires a ratio of the second cell height y2 to the first cell height y1 to be at least 1.5.

Figure 3:
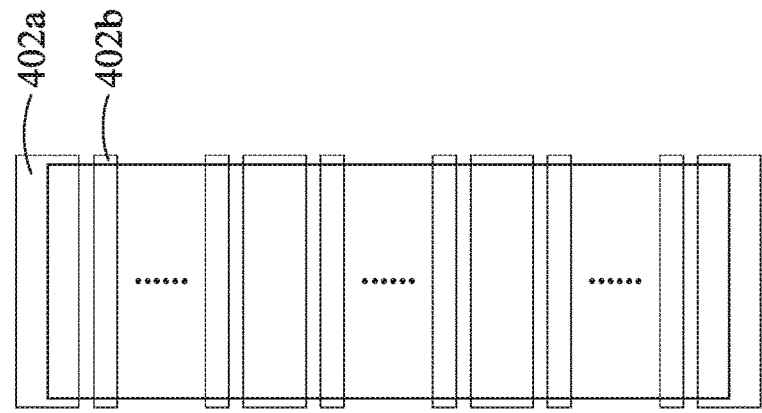
FIG. 3 illustrates top views of different layers of a device layout defined by standard cells and showing a dielectric gate between standard cells, according to an embodiment of the present disclosure.
Figure 3:
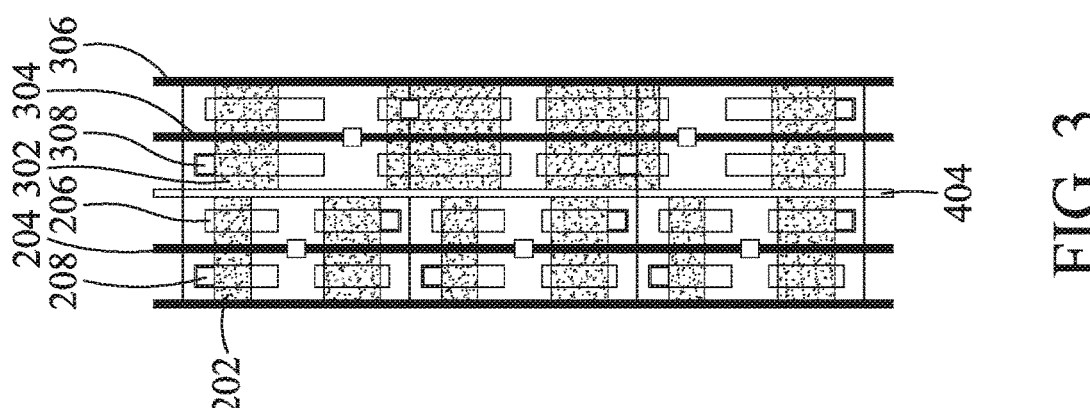
Figure 3:
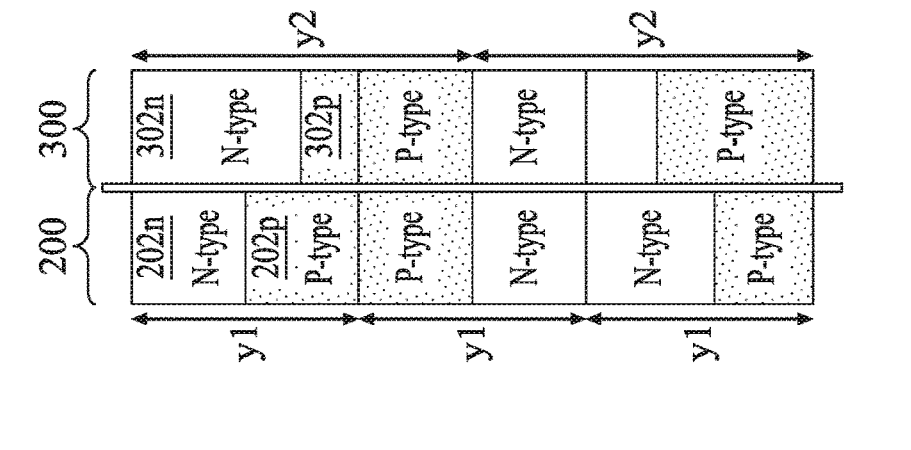

FIG. 3 illustrates top views of different layers in a device layout 100. FIG. 3 illustrates similar features as FIGS. 2A-2C, and the similar features will not be repeated again for the sake of brevity. In FIG. 3, the device layout 100 is defined by standard cells 200 and 300 and has a dielectric gate 404 between the standard cells 200 and 300. The dielectric gate 404 orients the same way as the metal gates 204/304 (i.e., extending lengthwise along the y direction) except that the dielectric gate 404 is not a gate and does not function as a gate. Instead, the dielectric gate 404 is a dielectric feature that includes one or more dielectric materials and functions as an isolation feature. The one or more dielectric materials may include silicon oxide, silicon oxynitride, fluorine-doped silicate glass (FSG), a low-k dielectric, combinations thereof, and/or other suitable materials. In some embodiments, the metal gates 204/304 and the dielectric gate 404 are collectively formed by a procedure, such as a gate-last process. For example, dummy gates are first formed by deposition and patterning, in which the patterning further includes lithography process and etching. Afterwards, a subset of the dummy gates is replaced to form the metal gates 204/304 by depositing a gate dielectric layer and a gate electrode while a dummy gate between the standard cells 200 and 300 is replaced to form a dielectric gate 404 by depositing only dielectric material(s). Furthermore, the dielectric gate 404 is disposed and configured differently and therefore functions differently.

In the present embodiment, the dielectric gate 404 is placed on a transition boundary (or border) of the standard cells 200 and 300 to function as isolation to separate one standard cell from an adjacent standard cell. The transition boundary can be defined as an edge of the first n-type and p-type wells 202n and 202p in the first standard cells 200 before these wells transition to a different well size (i.e., well size of the second standard cells 300). Alternatively, the transition boundary can be defined as an edge of the second n-type and p-type wells 302n and 302p in the second standard cells 300 before these wells transition to a different well size (i.e., well size of the first standard cells 200). In the embodiment shown in FIG. 3, a single dielectric gate 404 is placed at a shared transition boundary at both edges of the standard cells 200 and 300.

Figure 4:
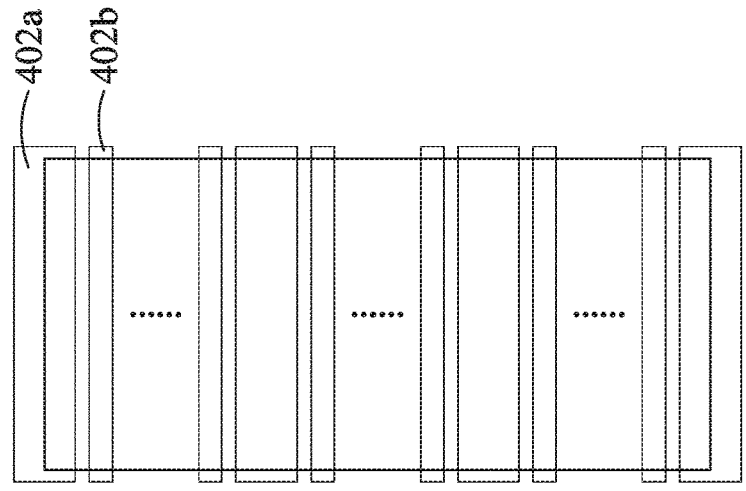
FIG. 4 illustrates top views of different layers of a device layout defined by standard cells and showing a transition well between standard cells, according to an embodiment of the present disclosure.

FIG. 4 illustrates top views of different layers in a device layout 100 according to another embodiment of the present disclosure. FIG. 4 illustrates similar features as FIG. 3, and the similar features will not be repeated again for the sake of brevity. The difference is that the device layout 100 in FIG. 4 includes a transition well 500 between the standard cells 200 and 300 along the x direction. The transition well 500 is a region where the well sizes gradually transitions from one setting to another (e.g., from well settings in the first standard cells 200 to well settings in the second standard cells 300). As such, the standard cells 200 and 300 do not directly abut each other and do not share a same transition boundary like in FIG. 3. Instead, there are two transition boundaries, one at an edge of the first n-type and p-type wells 202n and 202p in the first standard cells 200 and at a first edge of the transition well 500, and another one at an edge of the second n-type and p-type wells 302n and 302p in the second standard cells 300 and at a second edge of the transition well. At these transition boundaries, the well settings begin to change from one well setting to another.

Still referring to FIG. 4, dielectric gates 404 are placed on each of these transition boundaries (i.e., each edge of the transition well 500). Therefore, the device layout 100 in FIG. 4 has at least two dielectric gates 404 between the standard cells 200 and 300. In further embodiments, there may be additional dielectric gates 404 within the transition well and between the two transition boundaries depending on gate-pitch designs. Having the transition well 500 and at least two dielectric gates 404 allows for further isolation between the IC devices between the standard cells 200 and 300, which is desirable since they operate at different well settings and active region sizes. Providing additional dielectric gates 404 in the transition well also provide pattern density adjustment for improved fabrication, such as etching, deposition and chemical mechanical polishing (CMP).

Figures 5A, 5B:
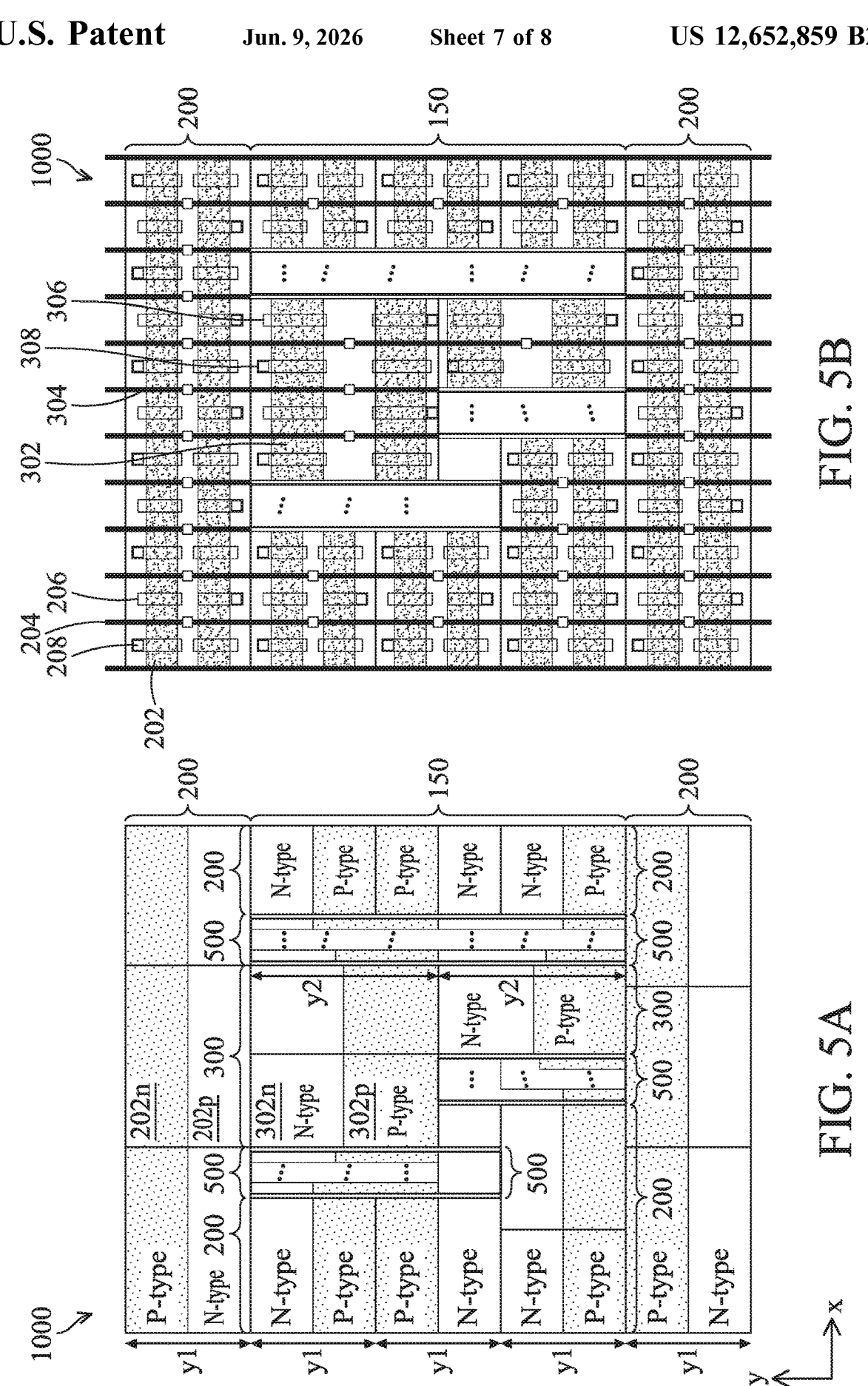
FIG. 5A illustrates a top view of a device layout block defined by standard cells and showing n-type and p-type wells over a substrate, according to an embodiment of the present disclosure.
FIG. 5B illustrates a top view of a device layout block defined by standard cells and showing device level structures over the n-type and p-type wells of FIG. 5A, according to an embodiment of the present disclosure.

FIG. 5A illustrates a top view of a device layout block 1000 showing n-type and p-type wells over a substrate, and FIG. 5B illustrates a top view of the device layout block 1000 showing device level structures over the n-type and p-type wells of FIG. 5A. The device layout block 1000 is defined by several first standard cells 200, second standard cells 300, and transition wells 500 laterally between the first and the second standard cells 200 and 300. As shown in FIG. 5A, second standard cells 300 having the second n-type and p-type wells 302n and 302p are enclosed and surrounded by first standard cells 200 having the first n-type and p-type wells 202n and 202p. In the x direction, due to change in well settings, there may be one or more transition wells 500 between the first and the second standard cells 200 and 300. However, in the y direction, the first and the second standard cells may directly abut each other for seamless integration without needing any transition regions. This is due to the periodic alignment of the first and second standard cells 200 and 300 in the y direction.

Still referring to FIGS. 5A and 5B, rows having the first standard cells 200 sandwich a hybrid region 150 along the y direction. The hybrid region 150 includes both first and second standard cells 200 and 300 and also transition wells 500 therebetween. In other embodiments, rows having the second standard cells 300 or other types of standard cells may sandwich the hybrid region 150 instead. In any case, hybrid regions 150 may be placed and dropped into larger device layout blocks 1000 without affecting the standard cell schemes of the larger device layout blocks 1000. Referring now to FIG. 5B, since some of the metal gates extends across different standard cells 200 and 300 in the y direction, the first metal gates 204 and the second metal gates 304 may share a same gate structure. Note however, at the transition boundaries of the transition wells 500, dielectric gates 404 separate gate structures along the y direction. Note also that due to the transition wells 500, it is possible to form first active regions 202 having different lengths in the x direction and second active regions 302 having different lengths in the x direction.

Figures 1, 2, 5C:
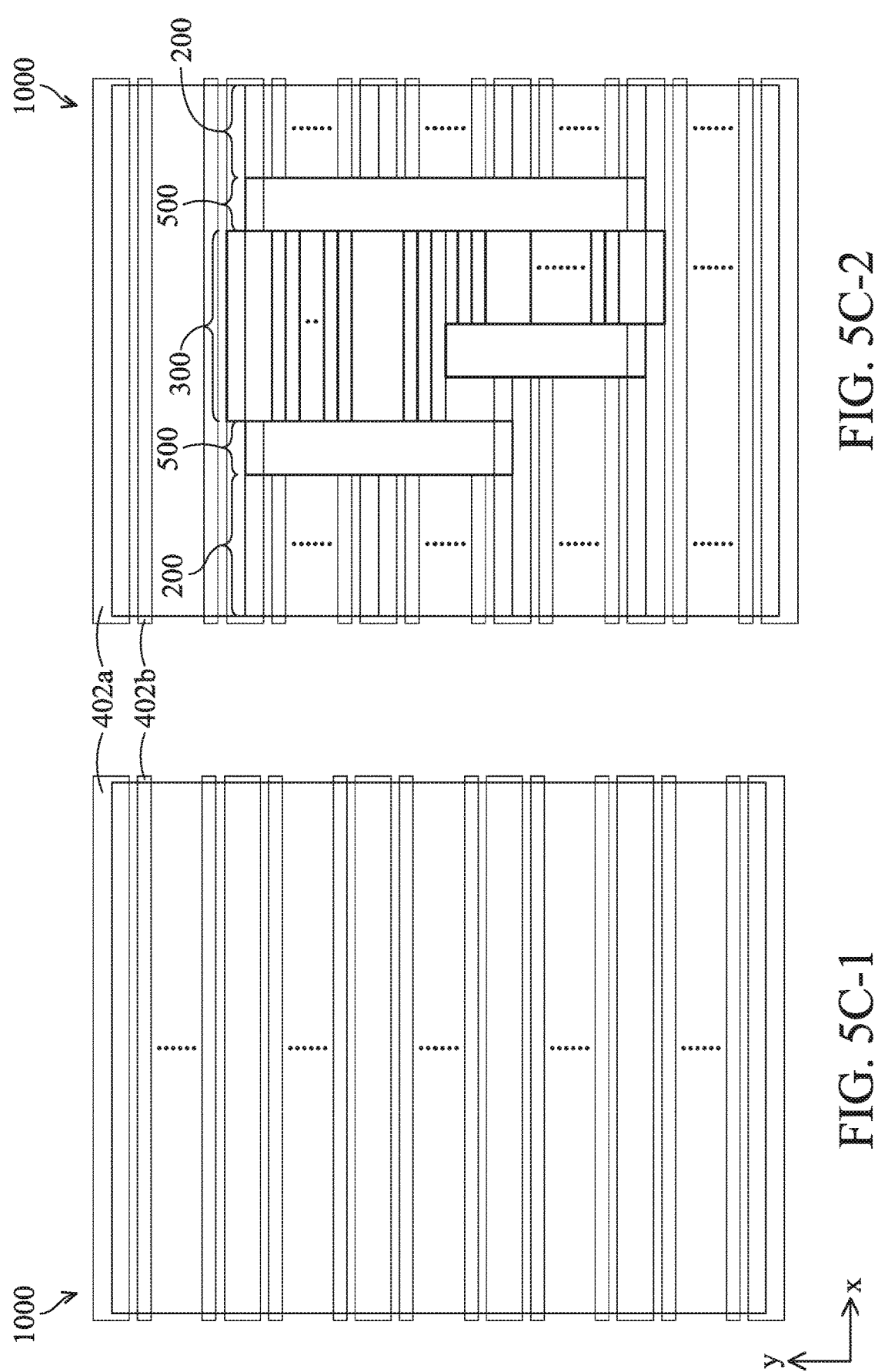

FIG. 5C-1 illustrates a top view of a device layout block 1000 showing metal lines 402a and 402b over the device level structures of FIG. 5B. FIG. 5C-1 is similar to FIG. 1C, and what has been described with respect to FIG. 1C equally applies to FIG. 5C-1. As shown, the metal lines 402a and 402b have the same width and length that extends over the first and the second standard cells 200 and 300 along the x direction. This is made possible by adjusting the location of the first and second metal vias 208 and 308 where the metal lines 402a and 402b will land on. Using the same upper metal placement setting (i.e., metal lines 402a and 402b) simplifies process complexity and promotes uniformity. That is, although the well type and the device level structures between the first and second standard cells 200 and 300 are different (to provide more device options), the upper metal placements can be the same between the first and second standard cells 200 and 300.

FIG. 5C-2 illustrates a top view of a device layout block 1000 showing metal lines 402a and 402b according to another embodiment of the present disclosure. These metal lines 402a and 402b are disposed over the device level structures of FIG. 5B. FIG. 5C-2 is different from FIG. 5C-1 in that the metal line settings for the metal lines 402a and 402b are changed to accommodate the different standard cell types. As shown, for better contact resistance and device performance, the metal lines 402a and/or 402b may be widened along the y direction in regions over the second standard cells 300 for contacting larger device structures below. In other words, metal lines 402a and 402b may have a first metal width along the y direction when extending over the first standard cells 200 and a second metal width along the y direction when extending over the second standard cells 300, and the second metal width is greater than the first metal width. The difference in width may cause misalignment along the x direction between the metal lines 402a and 402b in the first standard cells 200 and in the second standard cells 300. As such, some of the metal lines 402a and 402b over the first standard cells 200 may be separated from some of the metal lines 402a and 402b over the second standard cells 300 by a space in one or more transition wells 500. The embodiments shown in FIGS. 5C-1 and 5C-2 allows standard cell schemes to have the flexibility to keep the same metal line settings across different standard cells or to adopt different metal line settings across different standard cells.

Although not limiting, the present disclosure offers advantages in standard cell layouts. One example advantage is forming standard cells having different sized wells adjacent to each other. The different sized wells accommodate different sized device active regions across a standard cell block. Another example advantage is periodically aligning the different standard cells for easy integration with a larger standard cell device layout. Another example advantage is incorporating one or more dielectric gates between standard cells of different cell heights for proper isolation between device active regions. These dielectric gates may be disposed over transition boundaries of the different standard cells or over transition boundaries of a transition well. Another example advantage is to allow same upper metal line settings across different standard cells for process simplification, or to have customized upper metal line settings across different standard cells for device improvement.

One aspect of the present disclosure pertains to a semiconductor structure. The semiconductor structure includes first standard cells having first active regions formed over first alternating n-type and p-type wells, the first active regions and the first alternating n-type and p-type wells each extends lengthwise along a first direction, each of the first standard cells includes a first n-type well and a first p-type well. The semiconductor structure includes second standard cells adjacent to the first standard cells along the first direction, the second standard cells having second active regions formed over second alternating n-type and p-type wells, the second active regions and the second alternating n-type and p-type wells each extends lengthwise along the first direction, each of the second standard cells includes a second n-type well and a second p-type well. The first standard cells have a first cell height along a second direction perpendicular to the first direction, the second standard cells have a second cell height along the second direction, and the second cell height is greater than the first cell height. The second active regions have a greater width along the second direction than the first active regions.

In an embodiment, a ratio of the second cell height to the first cell height is about 1.5.

In an embodiment, edge boundaries of the first standard cells are periodically aligned with edge boundaries of the second standard cells along the first direction. In a further embodiment, the edge boundaries are periodically aligned after every three first standard cell height and every two second standard cell height.

In an embodiment, the semiconductor structure further includes metal gates over the first and the second active regions, the metal gates extending lengthwise along the second direction; and first and second source/drain (S/D) contacts over the first and the second active regions, respectively, each of the metal gates being interposed between the S/D contacts along the first direction. The first S/D contacts have a first length along the second direction, the second S/D contacts have a second length along the second direction, and the second length is greater than the first length.

In a further embodiment, the semiconductor structure further includes metal vias over the metal gates and over the first and the second S/D contacts; and metal lines extending lengthwise along the first direction over the metal vias, wherein the metal lines have a same width along the second direction when extending over the first standard cells and the second standard cells.

In a further embodiment, the semiconductor structure further includes metal vias over the metal gates and over the first and the second S/D contacts; and metal lines extending lengthwise along the first direction over the metal vias. The metal lines have a first metal width along the second direction when extending over the first standard cells and a second metal width along the second direction when extending over the second standard cells, and the second metal width is greater than the first metal width.

In an embodiment, each of the first active regions has a first width along the second direction, each of the second active regions has a second width along the second direction, and the second width is greater than the first width.

In an embodiment, the first active regions in each first standard cells includes an active region having a first width along the second direction over an n-type well and another active region having a third width along the second direction over a p-type well, and the first width is different from the third width. The second active regions in each second standard cells includes an active region having a second width along the second direction over an n-type well and another active region having a fourth width along the second direction over a p-type well, and the second width is different from the fourth width. In a further embodiment, each of the second width and the fourth width is greater than each of the first width and the third width.

Another aspect of the present disclosure pertains to a semiconductor structure. The semiconductor structure includes first standard cells having first active regions formed over first alternating n-type and p-type wells, the first active regions and the first alternating n-type and p-type wells each extends lengthwise along a first direction. The semiconductor structure includes second standard cells adjacent to the first standard cells along the first direction, the second standard cells having second active regions formed over second alternating n-type and p-type wells, the second active regions and the second alternating n-type and p-type wells each extends lengthwise along the first direction. The semiconductor structure includes metal gates over the first and the second active regions in the first and second standard cells, the metal gates extending lengthwise along a second direction perpendicular to the first direction. The semiconductor structure includes a dielectric gate between the first and the second standard cells at a transition boundary between the first and the second alternating n-type and p-type wells, the dielectric gate extending lengthwise along the second direction. The first n-type wells and the first p-type wells have a first width along the second direction, the second n-type wells and the second p-type wells have a second width along the second direction, and the second width is greater than the first width.

In an embodiment, the second active regions have a greater width along the second direction than the first active regions.

In an embodiment, the dielectric gate is a first dielectric gate, and the semiconductor structure further includes a transition well between the first and the second standard cells along the first direction; and a second dielectric gate. The transition well transitions first widths of the first n-type wells and the first p-type wells to second widths of the second n-type wells and the second p-type wells. The first dielectric gate extends along a first edge of the transition well along the second direction, and the second dielectric gate extends along a second edge of the transition well along the second direction.

In a further embodiment, the semiconductor structure further includes one or more dielectric gates in the transition well and between the first dielectric gate and the second dielectric gate. In a further embodiment, the semiconductor structure further includes metal lines extending lengthwise along the first direction over the first standard cells and second standard cells. Metal lines over the first standard cells are separated from metal lines over the second standard cells by a space in the transition well.

In an embodiment, the semiconductor structure further includes third standard cells having third active regions formed over third alternating n-type and p-type wells, the third active regions and the third alternating n-type and p-type wells each extends lengthwise along the first direction. The third n-type wells and the third p-type wells have the first width along the second direction. The first and the third standard cells directly abut each other along the second direction, and the second and the third standard cells directly abut each other along the second direction.

Another aspect of the present disclosure pertains to a semiconductor structure. The semiconductor structure includes a first standard cell having a first n-type well and a first p-type well extending lengthwise along a first direction. The semiconductor structure includes a second standard cell adjacent to the first standard cell along the first direction, the second standard cell having a second n-type well and a second p-type well extending lengthwise along the first direction. The semiconductor structure includes a dielectric gate at a boundary between the first and the second standard cells, the dielectric gate extending lengthwise along a second direction perpendicular to the first direction. The first standard cell has a first cell height along the second direction, the second standard cell has a second cell height along the second direction, and the second cell height is greater than the first cell height.

In an embodiment, the first n-type well and the first p-type well have a same first width along the second direction, the second n-type well and the second p-type well have a same second width along the second direction, and the second width is greater than the first width. In a further embodiment, the semiconductor structure further includes a first active region extending lengthwise along the first direction over the first n-type well; a second active region extending lengthwise along the first direction over the first p-type well; a third active region extending lengthwise along the first direction over the second n-type well; and a fourth active region extending lengthwise along the second direction over the second p-type well. The third and the fourth active regions have greater widths along the second direction than the first and the second active regions. In a further embodiment, the first active region has a different width from the second active region along the second direction. The third active region has a different width from the fourth active region along the second direction.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
   first standard cells having first active regions formed over first alternating n-type and p-type wells, the first active regions and the first alternating n-type and p-type wells each extend lengthwise along a first direction, each of the first standard cells includes a first n-type well and a first p-type well; and
   second standard cells adjacent to the first standard cells along the first direction, the second standard cells having second active regions formed over second alternating n-type and p-type wells, the second active regions and the second alternating n-type and p-type wells each extend lengthwise along the first direction, each of the second standard cells includes a second n-type well and a second p-type well,
   wherein the first standard cells have a first cell height along a second direction perpendicular to the first direction, the second standard cells have a second cell height along the second direction, and the second cell height is greater than the first cell height,
   wherein the second active regions have a greater width along the second direction than the first active regions.

2. The semiconductor structure of claim 1, wherein a ratio of the second cell height to the first cell height is about 1.5.

3. The semiconductor structure of claim 1, wherein edge boundaries of the first standard cells are periodically aligned with edge boundaries of the second standard cells along the first direction.

4. The semiconductor structure of claim 3, wherein the edge boundaries are periodically aligned after every three first standard cell height and every two second standard cell height.

5. The semiconductor structure of claim 1, further comprising:
   metal gates over the first and the second active regions, the metal gates extending lengthwise along the second direction; and
   first and second source/drain (S/D) contacts over the first and the second active regions, respectively, each of the metal gates being interposed between the first and second S/D contacts along the first direction,
   wherein the first S/D contacts have a first length along the second direction, the second S/D contacts have a second length along the second direction, and the second length is greater than the first length.

6. The semiconductor structure of claim 5, further comprising:

metal vias over the metal gates and over the first and the second S/D contacts; and metal lines extending lengthwise along the first direction over the metal vias, wherein the metal lines have a same width along the second direction when extending over the first standard cells and the second standard cells.

7. The semiconductor structure of claim 5, further comprising:

metal vias over the metal gates and over the first and the second S/D contacts; and metal lines extending lengthwise along the first direction over the metal vias, wherein the metal lines have a first metal width along the second direction when extending over the first standard cells and a second metal width along the second direction when extending over the second standard cells, and the second metal width is greater than the first metal width.

8. The semiconductor structure of claim 1, wherein each of the first active regions has a first width along the second direction, each of the second active regions has a second width along the second direction, and the second width is greater than the first width.

9. The semiconductor structure of claim 1, wherein the first active regions in each first standard cells includes an active region having a first width along the second direction over an n-type well and another active region having a third width along the second direction over a p-type well, and the first width is different from the third width, wherein the second active regions in each second standard cells includes an active region having a second width along the second direction over an n-type well and another active region having a fourth width along the second direction over a p-type well, and the second width is different from the fourth width.

10. The semiconductor structure of claim 9, wherein each of the second width and the fourth width is greater than each of the first width and the third width.

11. A semiconductor structure, comprising:

first standard cells having first active regions formed over first alternating n-type and p-type wells, the first active regions and the first alternating n-type and p-type wells each extend lengthwise along a first direction;

second standard cells adjacent to the first standard cells along the first direction, the second standard cells having second active regions formed over second alternating n-type and p-type wells, the second active regions and the second alternating n-type and p-type wells each extend lengthwise along the first direction;

metal gates over the first and the second active regions in the first and second standard cells, the metal gates extending lengthwise along a second direction perpendicular to the first direction; and a dielectric gate between the first and the second standard cells at a transition boundary between the first and the second alternating n-type and p-type wells, the dielectric gate extending lengthwise along the second direction, wherein the first n-type wells and the first p-type wells have a first width along the second direction, the second n-type wells and the second p-type wells have a second width along the second direction, and the second width is greater than the first width.

12. The semiconductor structure of claim 11, wherein the second active regions have a greater width along the second direction than the first active regions.

13. The semiconductor structure of claim 11, wherein the dielectric gate is a first dielectric gate, further comprising:

a transition well between the first and the second standard cells along the first direction; and a second dielectric gate, wherein the transition well transitions first widths of the first n-type wells and the first p-type wells to second widths of the second n-type wells and the second p-type wells, wherein the first dielectric gate extends along a first edge of the transition well along the second direction, and the second dielectric gate extends along a second edge of the transition well along the second direction.

14. The semiconductor structure of claim 13, further comprising one or more dielectric gates in the transition well and between the first dielectric gate and the second dielectric gate.

15. The semiconductor structure of claim 13, further comprising:

metal lines extending lengthwise along the first direction over the first standard cells and the second standard cells, wherein metal lines over the first standard cells are separated from metal lines over the second standard cells by a space in the transition well.

16. The semiconductor structure of claim 11, further comprising:

third standard cells having third active regions formed over third alternating n-type and p-type wells, the third active regions and the third alternating n-type and p-type wells each extend lengthwise along the first direction, wherein the third n-type wells and the third p-type wells have the first width along the second direction, wherein the first and the third standard cells directly abut each other along the second direction, and the second and the third standard cells directly abut each other along the second direction.

17. A semiconductor structure, comprising:

a first standard cell having a first n-type well and a first p-type well extending lengthwise along a first direction;

a second standard cell adjacent to the first standard cell along the first direction, the second standard cell having a second n-type well and a second p-type well extending lengthwise along the first direction; and a dielectric gate at a boundary between the first and the second standard cells, the dielectric gate extending lengthwise along a second direction perpendicular to the first direction, wherein the first standard cell has a first cell height along the second direction, the second standard cell has a second cell height along the second direction, and the second cell height is greater than the first cell height.

18. The semiconductor structure of claim 17, wherein the first n-type well and the first p-type well have a same first width along the second direction, the second n-type well and the second p-type well have a same second width along the second direction, and the second width is greater than the first width.

19. The semiconductor structure of claim 17, further comprising:

a first active region extending lengthwise along the first direction over the first n-type well;

a second active region extending lengthwise along the first direction over the first p-type well;

a third active region extending lengthwise along the first direction over the second n-type well; and a fourth active region extending lengthwise along the second direction over the second p-type well, wherein the third and the fourth active regions have greater widths along the second direction than the first and the second active regions.

20. The semiconductor structure of claim 19, wherein the first active region has a different width from the second active region along the second direction, wherein the third active region has a different width from the fourth active region along the second direction.

* * * * *